United States Patent [19]
Ostapiak et al.

[11] 3,812,435

[45] May 21, 1974

[54] PULSE WIDTH STABILIZED BLOCKING OSCILLATOR

[75] Inventors: Roman Ostapiak, Pine Brook, N.J.; Rudolph Scuderi, New York, N.Y.

[73] Assignee: Bell Telephone Laboratories, Incorporated, Murray Hill, N.J.

[22] Filed: Dec. 26, 1972

[21] Appl. No.: 318,089

[52] U.S. Cl. .................. 331/112, 331/148

[51] Int. Cl. .................. H03k 3/30

[58] Field of Search .................. 331/112, 148

[56] References Cited

UNITED STATES PATENTS 3,158,751 11/1964 Nelson .................. 331/112 X

Primary Examiner—Herman Karl Saalbach
Assistant Examiner—Siegfried H. Grimm
Attorney, Agent, or Firm—A. G. Steinmetz

[57] ABSTRACT

A blocking oscillator includes a pulse width control circuit which diverts base current from the base drive of the blocking oscillator transistor. This permits the blocking oscillator transistor to turn off and establish a predetermined pulse width independently of its $\beta$ characteristic and the supply voltage energizing the blocking oscillator.

5 Claims, 2 Drawing Figures

PATENTED MAY 21 1974 3,812,435

PULSE WIDTH STABILIZED BLOCKING OSCILLATOR

BACKGROUND OF THE INVENTION

1. Field of the Invention

This invention relates to astable blocking oscillators, and it is specifically concerned with a pulse width stabilized astable blocking oscillator.

2. Description of the Prior Art

The typical blocking oscillator in the prior art, such as shown in FIG. 1, operates by utilizing regenerative feedback to drive a transistor into saturation. This same regenerative feedback is then used to turn the transistor off. The $\beta$ characteristic of the transistor and the voltage source magnitude are factors which determine in part the pulse width of the output signal of the blocking oscillator. These characteristics may be best understood by describing the operation of the prior art blocking oscillator disclosed in FIG. 1.

Initially assume that the blocking oscillator transistor 110 is nonconducting. The current source 105 linearly charges the timing capacitor 108. The resultant voltage of the capacitor 108 is applied, via resistor 101, to the base 113 of transistor 110. As the current output of the current source 105 continues to charge the capacitor 108, the voltage across the capacitor 108 will reach a threshold value at which the voltage drop from the base 113 to the emitter 111 of transistor 110 is sufficient to turn the transistor 110 on. The transistor 110 at this time begins to conduct. A current flows from the DC source input terminal 100 through the primary winding 117 of transformer 115 and from thence through the transistor 110 to the ground 120.

The resulting voltage developed across winding 117 of the transformer 115 is coupled to the base winding 116 in a direction to further increase the base voltage applied to the transistor 110. The transistor 110 is regeneratively driven into saturation. Transistor 110 is now in the pulse state with the entire supply voltage across transformer 115 which is coupled via windings 116 and 118 to the base circuit and the load resistor 114. The collector current of the transistor 110 is essentially the sum of the winding currents at this time.

Assuming the timing current output of the current source 105 is negligible, when transistor 110 switches regeneratively into the pulse state, the current flowing through the resistor 101, capacitor 108, and the base 113 of transistor 110 steps to a value determined by the supply voltage applied to terminal 100 and the resistance of the resistors 101 and 102. This current decays exponentially towards zero. When the base current reduces to the value at which the product of $\beta$ times that current is equal to the collector current flowing in transistor 110, transistor 110 switches into its active region. The resulting increase in collector to emitter voltage of transistor 110 reduces the voltage across the winding 117 of the transformer 115. This incremental decrease in voltage across the transformer winding 117 is coupled, via winding 116, to the base 113 of transistor 110 and it regeneratively switches into its non-conducting state, terminating the output pulse across resistor 114.

The initial value of the base current is determined in part by the supply voltage and the termination of the pulse interval is determined in part by the $\beta$ of the transistor. These two characteristics affect the duration of the pulse output of the blocking oscillator. In situations where pulse width accuracy is critical, the conventional blocking oscillator may not be satisfactory because the $\beta$ of transistors tends to vary. Also, to maintain a specific pulse width, the source voltage applied to the blocking oscillator must be carefully regulated.

It is therefore an object of the invention to eliminate the dependence of the pulse width of a blocking oscillator output signal upon the $\beta$ of its transistor and the magnitude of its supply voltage.

SUMMARY OF THE INVENTION

In accordance with the invention, an astable blocking oscillator includes a control network to terminate conduction in the blocking oscillator transistor independently of the transistor's $\beta$ and the magnitude of the source voltage of the blocking oscillator. The control network includes a turnoff transistor added to specifically turn off the blocking oscillator transistor by diverting the base drive current from the control electrode of the blocking oscillator transistor and two clamping arrangements. A first clamping arrangement controls the charging of the timing capacitor independently of the energizing source voltage applied to the blocking oscillator. A second clamping arrangement establishes a threshold voltage at which the timing capacitor actuates the turnoff transistor to turn off the blocking oscillator transistor.

A feature of the invention is a backup pulse width control to limit the pulse width of the output should the source voltage be too small to operate the clamping arrangements.

BRIEF DESCRIPTION OF THE DRAWING

A more complete understanding of the invention and its many objects, features, and advantages may be obtained by reference to the following detailed description and the accompanying drawing in which.

DETAILED DESCRIPTION

Figure 1:
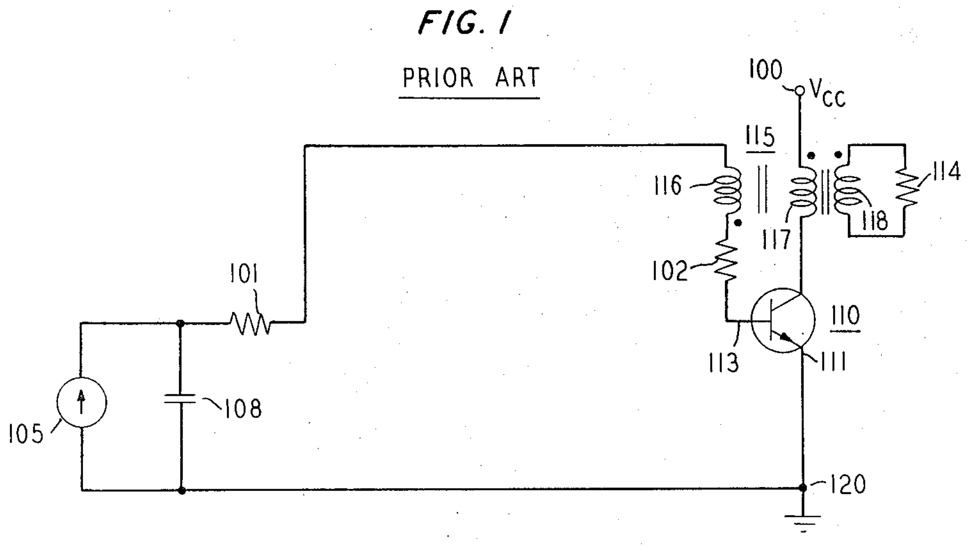
FIG. 1 PRIOR ART
FIG. 1 is a schematic of a blocking oscillator according to the prior art which is described hereinabove.
Figure 2:
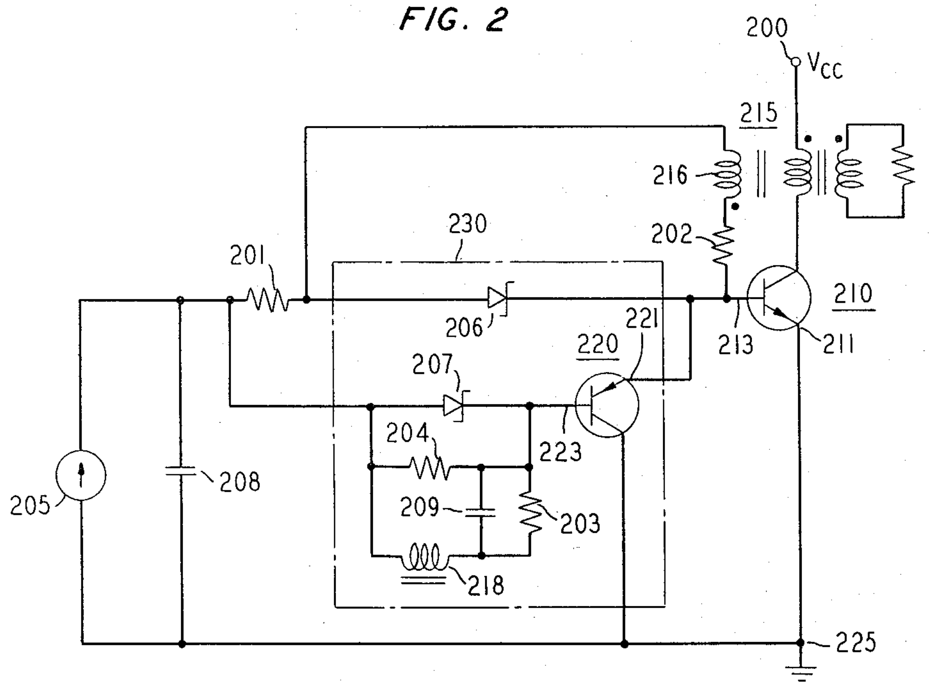
FIG. 2 is a schematic of a blocking oscillator with a pulse width control circuit according to the principles of the invention.

The blocking oscillator disclosed in FIG. 2 initially operates substantially the same as the blocking oscillator disclosed in FIG. 1. It differs from the circuit in FIG. 1 in that it includes a pulse width control circuit which is added to the blocking oscillator to control the output pulse width independently of the DC source connected to terminal 200 and the $\beta$ of the blocking oscillator transistor 210. This added pulse width control circuitry is contained within the dotted enclosure 230 and includes a turnoff transistor 220, two voltage breakdown diodes 206 and 207, two resistors 203 and 204, a capacitor 209, and a control winding 218.

The transistor 220 is used to turn off the blocking oscillator transistor 210 and thus determine the width of the blocking oscillator pulse. The breakdown diode 206 shunts the feedback winding 216. The diode 207 and the resistor 204 connected in series with the paralleled resistor 203 and capacitor 209 act as a voltage reference and a divider network, respectively, to control the voltage across the control winding 218. The control winding 218 is wound on the core of the blocking oscillator transformer 215.

Initially the blocking oscillator operates substantially similarly to the blocking oscillator disclosed in FIG. 1. The current source 205 charges the capacitor 208 until the voltage appearing across the base terminal 213 to the emitter terminal 211 is sufficient to turn on the blocking oscillator transistor 210. The breakdown diode 206 connected across the feedback winding 216 controls the voltage drop thereacross and hence causes the feedback winding 216 to function in a manner analogous to a constant voltage source. This constant voltage in combination with the resistance 201 controls the charging current applied to the timing capacitor 208 independently of the source voltage applied to the input terminal 200. The charging current control is operative as long as the input source voltage has a sufficient magnitude to cause the breakdown of diode 206.

After the blocking oscillator transistor 210 is biased conducting, the current flow through the transistor 210 increases regeneratively as described hereinabove with reference to the blocking oscillator disclosed in FIG. 1.

When the blocking oscillator transistor 210 is initially turned on, the turnoff transistor 220 is biased in a nonconducting state by the high voltage across the timing capacitor 208. As the timing capacitor 208 charges, the voltage applied to the base 223 of transistor 220 decreases until eventually the transistor 220 is biased conducting and turns transistor 210 off.

The voltage of the timing capacitor 208 is applied to the base 223 of transistor 220 via the breakdown diode 207. The breakdown diode 207 is activated by the voltage of the control winding 218 derived from the blocking oscillator transformer 215 to which it is magnetically coupled. The voltage across the control winding 218 is applied to diode 207, via a voltage divider including resistors 203 and 204. The voltage divider includes a capacitor 209 shunting resistor 203 to facilitate a rapid breakdown of the diode 207.

The voltage drop across diode 207 acts in a fashion analogous to a voltage source and serves as a fixed voltage differential added to the voltage of the capacitor 208 to determine when the transistor 220 is biased into a conducting condition. This may be best explained by considering the voltages in the closed circuit loop comprising diodes 206 and 207, resistor 201, and the base emitter junction of transistor 220, after the transistor 210 begins to conduct. The characteristics of the breakdown diodes 206 and 207 are selected so that the breakdown voltage of diode 206 is greater than the breakdown voltage of diode 207. The voltage difference is absorbed by voltage drops across the resistor 201 and the base emitter junction of transistor 220. As is apparent from inspection, the voltage polarity across resistor 201 and diode 206 opposes the voltage polarity across diode 207 and the base emitter junction of transistor 220. As the base current through the resistor 201 decreases, due to the increasing voltage across capacitor 208, the voltage across resistor 201 decreases. In response to this decrease in voltage, the voltage across the base emitter junction of transistor 220 and diode 207 increases until transistor 220 turns on.

It is apparent from the foregoing that the voltage drops across the diodes 207 and 206 are fixed and hence serve only to establish a frame of reference by which the voltage drop across resistor 201 is used to control the conductivity of transistor 220.

When the transistor 220 becomes conducting, the base current normally applied to the base 213 of transistor 210 is diverted to the ground 225, via transistor 220. This turns the transistor 210 off after a predetermined time duration irrespective of the value of its $\beta$. Once transistor 210 has been biased nonconducting, the capacitor 208 begins charging again and the blocking oscillation cycle is repeated.

A feature of the invention is the ability of the pulse width control circuit 230 to operate to control the pulse width of the output independently of the $\beta$ of the blocking oscillator transistor 210, and to some extent the source voltage, even when the source voltage is insufficient to activate the breakdown diodes 206 and 207. In instances of a low source voltage applied to terminal 200, the voltage drop across the control winding 218 will control the pulse width in the same manner as described hereinabove in describing the function of the voltage drop across diode 207 in controlling the transistor 220.

What is claimed is:

1. A blocking oscillator comprising a power transistor having a main conduction path and a control electrode, a regenerative feedback transformer including a primary winding connected to the main conduction path and a secondary winding connected to the control electrode, a resistor and capacitor connected in series and connected to said control electrode, wherein the improvement comprises, a third winding wound on said transformer, a first breakdown diode shunting said secondary winding, a second breakdown diode having a lower breakdown threshold than said first breakdown diode and shunting said third winding, a control transistor, including a main conduction path and a control electrode, said main conduction path of said control transistor being connected to the control electrode of said power transistor, said resistor, said first breakdown diode, said second breakdown diode, and a junction of the main conduction path and the control electrode of said control transistor being connected into a closed loop, said first breakdown diode being poled to break down in response to the feedback current of said secondary winding and said second breakdown diode being poled in an opposite direction to said first breakdown diode, whereby the voltage drop across said resistor offset by the opposing voltage drops across said first and second breakdown diodes activates said control transistor to turn off said power transistor.

2. A blocking oscillator comprising, a power transformer having first, second, and third windings, a power transistor having a control electrode and a main conduction path, the main conduction path of said power transistor being connected to said first winding, a timing capacitor coupled to the control electrode of said power transistor and to said second winding, a pulse width control circuit comprising a control transistor having a main conduction path and a control electrode, the main conduction path of said control transistor being connected to the control electrode of said power transistor to control the turnoff of said power transistor, a resistor, a first breakdown diode to establish a reference voltage shunting said second winding and connected in series with said resistor, said first breakdown diode coupling said timing capacitor to the control electrode of said power transistor, a second breakdown diode coupling said timing capacitor to the control electrode of said control transistor, said third winding connected in a path parallel to said second breakdown diode, whereby said first breakdown diode and the resistor control the charging of said timing capacitor, and said second breakdown diode energized by said third winding generates a voltage to linearly shift the voltage supplied by said timing capacitor to switch said control transistor.

3. A blocking oscillator as defined in claim 2 wherein, the breakdown voltage of said first breakdown diode is greater than the breakdown voltage of said second breakdown diode.

4. A blocking oscillator as defined in claim 2 wherein said first and second breakdown diodes and a junction of the control transistor are connected to form a closed loop and a voltage divider shunting said second breakdown diode and including said third winding.

5. A blocking oscillator comprising a power transistor having a main conduction path and a control electrode, a timing network, a regenerative feedback transformer including a primary winding, a second feedback winding, and a third feedback winding, a first breakdown diode and a resistor connected in series and connecting said timing network to the second feedback winding, said first breakdown diode poled in a direction to break down in response to the feedback signal of said second feedback winding, a control transistor having a main conduction path and a control electrode, the main conduction path of said control transistor being connected to divert current from the control electrode of said power transistor in order to control the switching of said power transistor, a second breakdown diode energized in a breakdown mode by said third feedback winding and connecting said timing network to the control electrode of said control transistor, said first breakdown diode having a higher breakdown threshold than said second breakdown diode in order to generate a control voltage differential to bias said control transistor into conduction.

* * * * *